United States Patent
Endoh

(10) Patent No.: US 6,541,897 B2
(45) Date of Patent: Apr. 1, 2003

(54) PIEZOELECTRIC DEVICE AND PACKAGE THEREOF

(75) Inventor: Hideo Endoh, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/052,727

(22) Filed: Jan. 23, 2002

(65) Prior Publication Data

US 2002/0113523 A1 Aug. 22, 2002

(30) Foreign Application Priority Data

Feb. 19, 2001 (JP) ........................................ 2001-042200
Oct. 12, 2001 (JP) ........................................ 2001-315762

(51) Int. Cl.⁷ ............................................... H03H 9/10
(52) U.S. Cl. ........................ 310/344; 310/340; 310/348
(58) Field of Search ................................ 310/340, 344, 310/348, 370, 345, 321; H02H 9/215

(56) References Cited

U.S. PATENT DOCUMENTS 4,384,232 A * 5/1983 Ddbely ........................ 310/370
2001/0022488 A1 * 9/2001 Kawauchi ..................... 310/348

FOREIGN PATENT DOCUMENTS

JP 56-65517 A 6/1981
JP 2001-7678 * 1/2001 .......... H03H/9/215

* cited by examiner

Primary Examiner—Thomas M. Dougherty
Assistant Examiner—Karen B Addison
(74) Attorney, Agent, or Firm—Oliff & Berridge, PLC

(57) ABSTRACT

A package for a piezoelectric resonator, includes an insulating base that has a rectangular box shape and made of laminated thin ceramics sheets, and a lid that is made of a thin rectangular sheet of transparent glass material and bonded on the top surface of the base. A tuning fork type quartz crystal resonator element is hermetically sealed in the package. The corners of the lid are cut off diagonally at an angle of approximately 45 degrees or rounded so as to correspond to the cutouts of quarter circles at the corners of the base that result from via holes for wiring inside the base. A predetermined sealing width on the top surface of the base between the lid and the inner periphery of the base and a sufficient margin width between the periphery of the lid and the outer periphery of the base are ensured at the corners. The base has a through hole which enables the inside of the package to communicate with the outside and is hermetically sealed in a vacuum atmosphere with sealing medium after the lid is bonded. Sufficient bonding and sealing strength between the base and lid is ensured while miniaturization and flattening of a piezoelectric resonator are implemented. Gas within the package is minimized and the package can be sealed with the inside being subject to a high vacuum.

13 Claims, 10 Drawing Sheets

(A)

(B)

(C)

(A)

(B)

(C)

(A)

(B)

(C)

(A)

(B)

(C)

(A)

(B)

(C)

(D)

(A)

(B)

(C)

(A)

(B)

(C)

(D)

PIEZOELECTRIC DEVICE AND PACKAGE THEREOF

BACKGROUND OF THE INVENTION

1. Field of Invention

The present invention relates to a piezoelectric device, such as a piezoelectric resonator, piezoelectric oscillator and SAW device used for electronic appliances. In particular, the invention relates to a package structure for a piezoelectric device, wherein a lid made of a thin glass sheet is bonded to a base that mounts a resonator element made of piezoelectric material, such as quartz crystal, by using low-melting point glass, and the resonator element is then hermetically sealed.

2. Description of Related Art

In accordance with the related art, various types of information and communication equipment and electronic appliances, such as OA machines and household electronic appliances, extensively use piezoelectric devices as a clock source for electronic circuits, such as a piezoelectric resonator, an oscillator including a piezoelectric resonator element and an IC chip sealed in the same package, and a real time clock module. In particular, a piezoelectric device must be miniaturized, flattened and suitable for surface mounting on a circuit board in response to the downsizing of the overall device, such as compact information appliances, including for example mobile computers and IC cards, and communication appliances, including for example cellular phones.

In general, a surface-mounted piezoelectric device has a package structure in which a lid is bonded to a base that mounts a piezoelectric resonator element and, if necessary, an IC device to be sealed. In particular, a related art technique uses a transparent glass material for the lid so that laser beams can be irradiated onto the piezoelectric resonator element from the exterior of the device to adjust the frequency after the sealing. FIGS. 9(A) and (B) show an example of a related art piezoelectric resonator having this package structure. The piezoelectric resonator has a package 3 including a base 1 made of insulating material and a lid 2, in which a tuning fork type quartz crystal resonator element 4 is hermetically sealed. The base 1 is a rectangular box made of laminated thin sheets of insulating material, such as ceramics, on the bottom of which the quartz crystal resonator element 4 is fixed at its base portion 4a in a cantilever manner, with conductive adhesive. The rectangular thin sheet lid 2 is hermetically bonded at its lower surface to the top surface of the base 1 by using low-melting point glass 5.

SUMMARY OF THE INVENTION

A package for a piezoelectric device is subject to, for instance, shock when dropped and external force when gripped by jigs during the mounting operation. Therefore, sealing strength is required for ensuring a sufficient hermetic state in the bonded and sealed part between the base and lid. However, the related art package structure described above simply bonds the top surface of a base to the lower surface of a lid using low-melting point glass. The horizontal joint surface receives the entire force, particularly, from the sides of the package. Therefore, to prevent the hermetic state at the bonded and sealed part from being impaired, which may result in performance loss or defects of the piezoelectric device, the lid is conventionally bonded to the top surface of the base with a predetermined sealing width (w1 in FIG. 9(A)), which is then surrounded by low-melting point glass 5 having a sufficient width (w2 in FIG. 9(A)), in order to enhance the strength of the device against lateral external force.

On the other hand, the base 1 is produced generally by laminating and bonding a predetermined number of large ceramic thin sheets 6 having a desired shape and size, and cutting it along the dotted lines 7 in FIG. 10 into a number of bases having a predetermined length and width. Here, castrations (round through holes) 8 are made at the intersections of the horizontal and vertical dotted lines 7 to facilitate cutting. This leaves a quarter circle shaped cutout on the corners of the divided base 1. When the rectangular lid is laid on it, as shown in FIG. 9(C), the corner of the base 1 does not have enough margin to hold low-melting point glass 5 outside the lid 2, or the corner of the lid 2 may even protrude from the outer limit of the base. In addition, if low-melting point glass 5 runs down the outer wall of the base 1, as shown in FIG. 9(C), a lateral external force may cause the low-melting point glass to crack, possibly impairing the hermetic state of the package. Conversely, if a margin is provided for the low-melting point glass to travel beyond the sealing width w1, sufficient bonding and sealing strength is ensured. However, this makes the package larger in length and width, limiting miniaturization of a piezoelectric device.

If less low-melting point glass is used to prevent the glass from running down the outer wall of the base 1, the low-melting point glass may not reach the periphery of the lid 2, and a space 10 may be defined between the lid 2 and the base 1, as shown in FIG. 9(D). If the package with the lid 2 and base 1 bonded in this way is subject to an external force from above, the space 10 may allow the initiation of cracking or breaking of the lid 2 that is made of glass material, and the hermetic state of the package may also be impaired.

The present invention addresses the problems in the related art described above, and an object of the invention is to provide a package structure for a piezoelectric device, that includes a package having a base on which a piezoelectric resonator element is mounted, and a lid that is made of glass material and bonded to the top surface of the base using low-melting point glass, the package structure ensuring sufficient bonding and sealing strength and enabling miniaturization and flattening of the device.

To attain the above object, the present invention provides a package for a piezoelectric device, including a base having a rectangular box shape, and a lid that is made of thin rectangular glass sheet and bonded onto the top surface of the base using low-melting point glass. A piezoelectric resonator element is hermetically sealed. The corners of the rectangular lid are cut off so that a margin with a predetermined width is defined entirely between the outer periphery of the base and the periphery of the lid.

Bonding the lid that is formed in this way to the base ensures a sufficient sealing width on the top surface of the base around the lid and a sufficient margin width for low-melting point glass to travel around. This provides sufficient bonding and sealing strength against a lateral external force applied to the package.

The corners of the lid can be formed differently than described above. The corners can be diagonally cut off in one embodiment, and rounded in another embodiment, for example. The lid can easily be processed into a desired shape using machining, chemical processes, such as etching, or monolithic molding, such as embossing.

In an embodiment, the cut off corners of the rectangular lid are tapered to the upper surfaces. This provides each corner of the package, which is highly possibly affected by a direct external force in the course of handling the piezoelectric device, with a sufficient sealing width and a margin at the corners of the lid described above. In addition, this tapered surface reduces horizontal force on each joint surface between the base top surface and the lid at each corner because it transforms the lateral force on the package into horizontal and vertical elements. In this way, a minor additional process to the lid ensures a practically sufficient bonding and sealing strength. In another embodiment, the lid is tapered to the upper surface along the periphery, providing enhanced bonding and sealing strength to the package.

In another embodiment, the lid is stepped on the upper surface thereof around the periphery. This reduces the possibility for the jigs to be trapped while handling the piezoelectric device for assembly, preferably reducing the risk of undesired external force to the package. The step can easily be formed by machining, chemical processes, such as etching, or monolithic molding, such as embossing.

In another embodiment, the lid is stepped on the lower surface thereof that engages with the inner periphery of the base. Bonding the step along the inner periphery of the base facilitates and ensures their positioning. Furthermore, the package can be reduced in height by the height of the step, realizing a flattened piezoelectric device. The step can easily be formed in a desired form by attaching low-melting point glass onto the lower surface of the lid in addition to the methods described above, i.e., machining, chemical processes, such as etching, or monolithic molding, such as embossing.

In another embodiment, the base has a through hole by which the inside of the package communicates with the exterior of the device and the through hole is hermetically closed with a sealing medium. The package can be vacuum sealed by filling the through hole in a vacuum atmosphere with a sealing medium after bonding the base to the lid. When the lid is bonded to the base using low-melting point glass, the heat may cause the gas to expand or occur in the package. In that case, particularly with a smaller package, increased pressure inside of the package may change the sealing width of low-melting point glass and affect the hermetic state.

However, in this embodiment, the gas inside of the package can be released via the through hole of the base to prevent the inside pressure from increasing. This maintains and ensures the hermetic state of the package. Furthermore, if a transparent lid is used, a laser beam can be irradiated from outside the lid after the package is sealed to evaporate and remove metal weight material that was previously attached to the surface of the piezoelectric resonator element, thereby enabling frequency adjustment.

Another aspect of the present invention provides a piezoelectric device including a package that is vacuum sealed as described above, and a tuning fork type piezoelectric resonator element having a base portion and a pair of resonating arms on the surfaces of which excitation electrodes are formed and sealed in the package. The tuning fork type piezoelectric resonator element has excitation electrodes including first electrodes that are formed on the main surfaces of the resonating arms, and second electrodes that are formed on the side surfaces of the resonating arms. The first electrodes include an electrode film that is coated on the side surfaces of a groove formed lengthwise at least on one of the main surfaces of the resonating arms.

The tuning fork type piezoelectric resonator element having the structure above is known, as is described for instance in Japanese Laid-Open Patent S56-65517. It is known that electric field efficiency can be significantly increased by producing an electric field parallel to the main surfaces of the resonating arms, which also suppresses the CI (Crystal Impedance) value.

However, the existence of gas, such as air, or an insufficient vacuum within the package, causes extra air resistance against the grooves formed on the main surfaces of the resonating arms during the flexural vibration of the resonating arms. A smaller tuning fork type piezoelectric resonator element, which results from downsizing the piezoelectric device, is subject to more restriction on the flexural vibration of the resonating arms and, therefore, the CI value may not be as low as expected. The piezoelectric device according to the present invention suppresses gas production from the low-melting point glass and conductive adhesive. The package can be sealed, with the inside being subject to a high vacuum. This ensures sufficient flexural vibration of the resonating arms and a sufficiently low CI value.

The present invention further provides a piezoelectric device including a package that can be vacuum sealed, and a tuning fork type piezoelectric resonator element having a base portion that is fixed on the base of the package and a pair of resonating arms on the surfaces of which excitation electrodes are formed and sealed in the package. The base portion of the tuning fork type piezoelectric resonator element has a constriction formed between the part fixed to the base and the resonating arms.

The tuning fork type piezoelectric resonator element blocks the resonation of the resonating arms at the constriction and does not allow it to reach the fixed part of the base portion. Therefore, the resonating arms have more freedom of flexural vibration and the CI value is maintained lower. However, the flexural vibration of the resonating arms is more restricted when the existence of gas, such as air, or insufficient vacuum within the package causes extra air resistance against the constriction. A smaller tuning fork type piezoelectric resonator element, which results from the downsizing of the piezoelectric device, is subject to more restriction on the flexural vibration of the resonating arms and, therefore, the CI value may not be as low as expected. The piezoelectric device according to the present invention also minimizes gas production from low-melting point glass or conductive adhesive. The package can be sealed, with the inside being subject to a high vacuum. This ensures more freedom of flexural vibration for the resonating arms as well as a sufficiently low CI value.

Another aspect of the present invention provides a piezoelectric device in which an IC device is further mounted in the package described above.

DETAILED DESCRIPTION OF PREFERRED EMBODIMENTS

Figure 1:
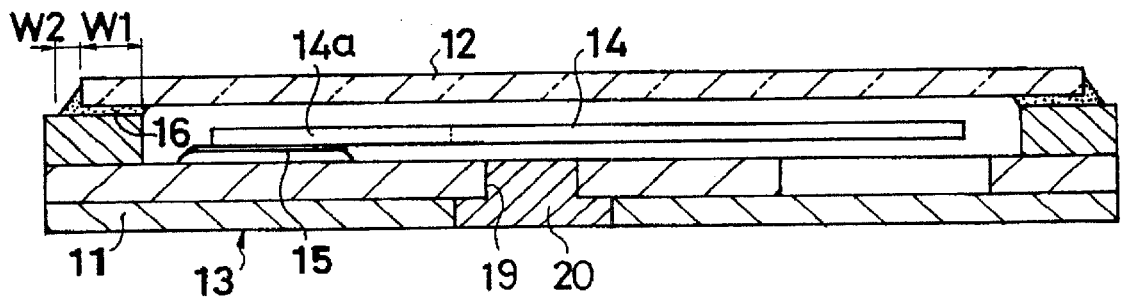
FIG. 1(A) is a vertical sectional view showing Embodiment 1 of the piezoelectric resonator according to present invention.
FIG. 1(B) is a plan view thereof.
FIG. 1(C) is an enlarged, partial sectional view taken along plane I—I in FIG. 1(B) showing the part bonded to the lid at the base corner.
Figure 1:
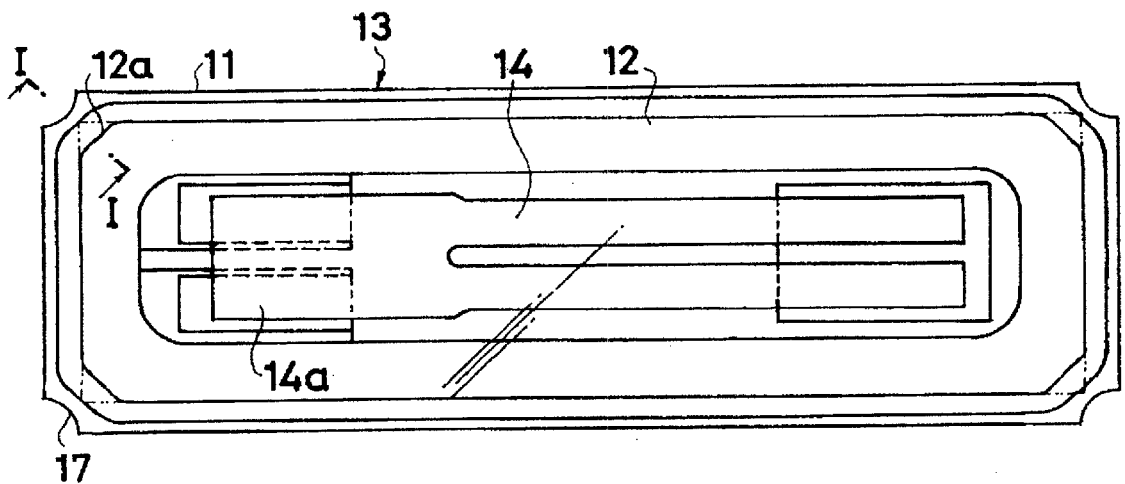
Figure 1:
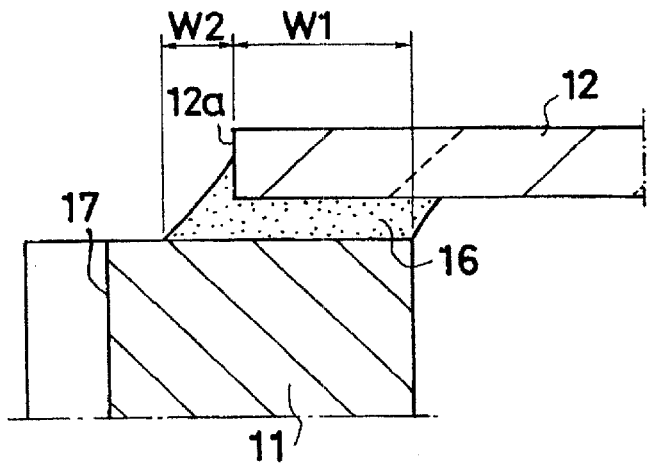

Preferred embodiments of the present invention are described hereafter, with reference to the attached drawings. The same reference numbers are given to similar structural elements in the drawings. FIGS. 1(A)–1(C) schematically show the structure of Embodiment 1 of the piezoelectric resonator to which the present invention is applied. This piezoelectric resonator has a package 13 including a base 11 made of insulating material and a lid 12. Inside the package 13, a tuning fork type quartz crystal resonator element 14 is hermetically sealed. The base 11 is formed by three laminated thin ceramics sheets, having a nearly rectangular box shape. The tuning fork type quartz crystal resonator element 14 is fixed with its base portion 14a on the recess bottom in the base 13 in a cantilever manner and nearly horizontally using conductive adhesive 15. The lid 12 is formed by a rectangular thin sheet of insulating material, such as glass or ceramic, and hermetically bonded on the top surface of the base 11 using low-melting point glass 16. When a tuning fork type quartz crystal resonator element is mounted in its existent state in this embodiment, a transparent glass lid is preferably used so that the frequency can be adjusted by irradiating a laser beam from the exterior of the package.

Figure 10:
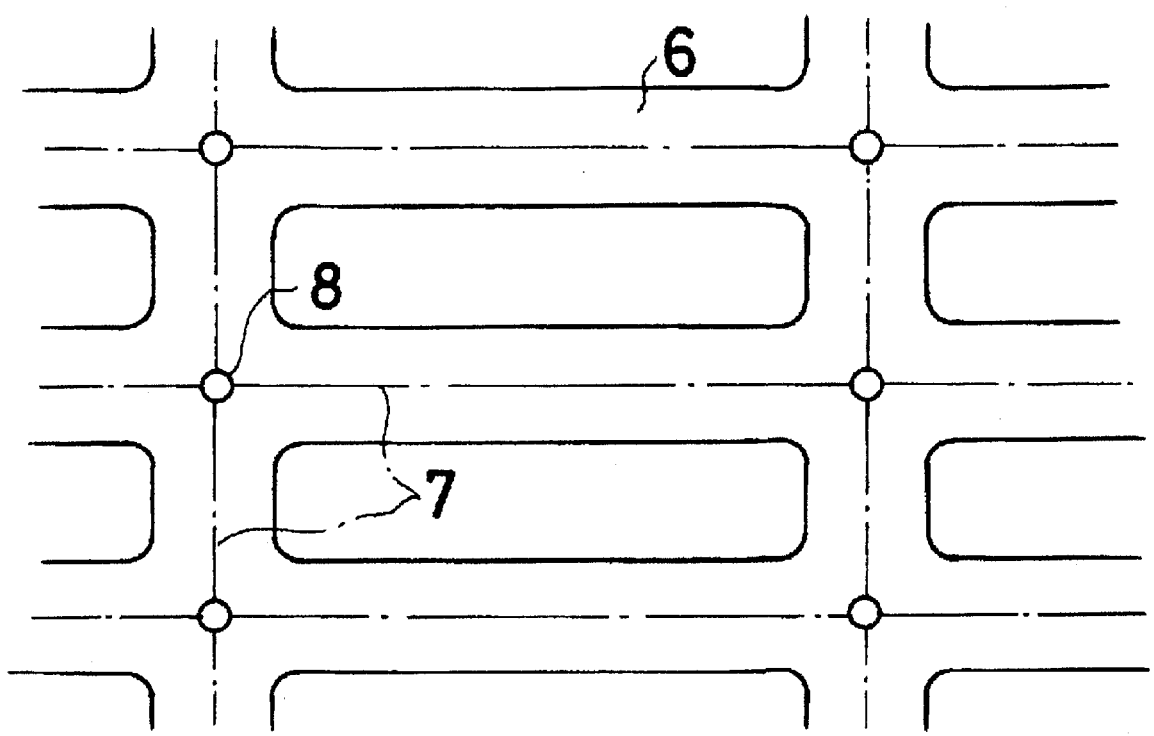
FIG. 10 is a plan view showing part of a thin ceramics sheet for producing bases.

The corners of the lid 11 are defined, as is described regarding the related art with reference to FIG. 10, by a quarter circle cutout 17 that results from the castration to facilitate dividing the base. The lid 12 is sized so as to reserve a predetermined sealing width w1 between the periphery of the lid and the inner periphery of the base 11 lengthwise and breadth-wise, and a sufficient margin width w2 on the top surface of the base along the periphery of the lid for low-melting point glass 16 to travel around with respect to the side of the base 11 lengthwise and breadth-wise. The corners 12a of the lid 12 are cut off diagonally at nearly 45 degrees so as to correspond to the cutout 17 and leave a margin having a sufficient width w2 between the lid and the edge of the base.

In this way, as is shown in FIG. 1(C), a sufficient sealing width w1 on the top surface of the base along the entire periphery of the lid 12, and a sufficient margin width w2 for low-melting point glass 16 to travel around are ensured also at the corners of the base 11. Accordingly, sufficient bonding and sealing strength is obtained, particularly against the lateral external force on the package 13. Furthermore, the base 11 can be reduced in length and width while the sealing width w1 and margin width w2 are maintained, thereby allowing miniaturization of the package.

A small round through hole 19 is formed in the bottom of the base 11 nearly at the center and hermetically closed with an appropriate sealing medium 20, such as Au—Sn alloy. Filling the sealing medium 20 is conducted, for instance, by putting a metal ball, such as Au—Su, from the exterior of the device on the step of the through hole 19, and welding it with a laser beam while the package 13 is in a vacuum atmosphere, after the quartz crystal resonator element 14 is mounted in the base 11 as described above and the lid 12 is bonded on the top surface of the base. With the vacuum sealed package 13, the oscillation frequency of the quartz crystal resonator element 14 can be finely adjusted by irradiating the laser beam through the transparent lid 12 from the exterior of the device to partially evaporate and remove the metal weight material for frequency adjustment that is previously fixed on the surface of the resonating arms of the quartz crystal resonator element 14.

The package 13 according to the present invention can reduce, minimize or prevent a pressure increase within the package because it allows a gas to escape via the through hole 19 that expands or occurs in the package due to heat in the process of bonding the lid 12 to the base 11 using low-melting point glass. The pressure increase within the package during the bonding of the lid 12 exerts more influence on the sealing property of the package with no through hole, particularly when it is miniaturized. The sealing width w1 of the low-melting point glass 16 changes, particularly around the corners of the base 11 and may not maintain the hermetic state in the worst case. The package structure according to the present invention ensures a hermetic state while allowing miniaturization, thereby presenting a quartz crystal resonator with high performance, high quality and high stability.

Figure 2:
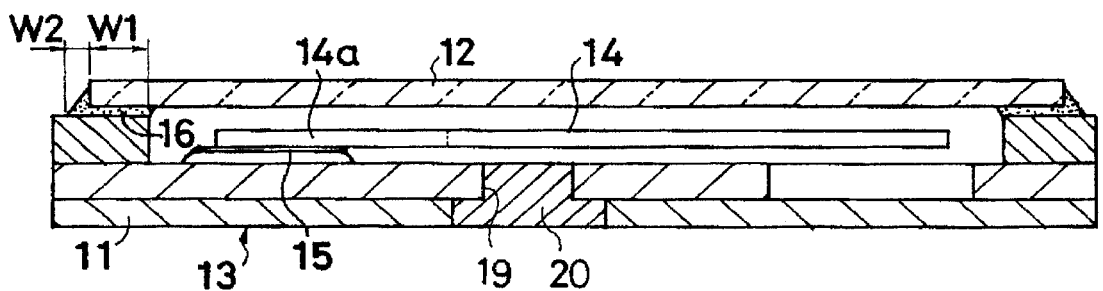
FIG. 2(A) is a vertical sectional view showing Embodiment 2 of the piezoelectric resonator according to present invention.
FIG. 2(B) is a plan view thereof.
FIG. 2(C) is an enlarged, partial sectional view taken along plane II—II in FIG. 2(B) showing the part bonded to the lid at the base corner.
Figure 2:
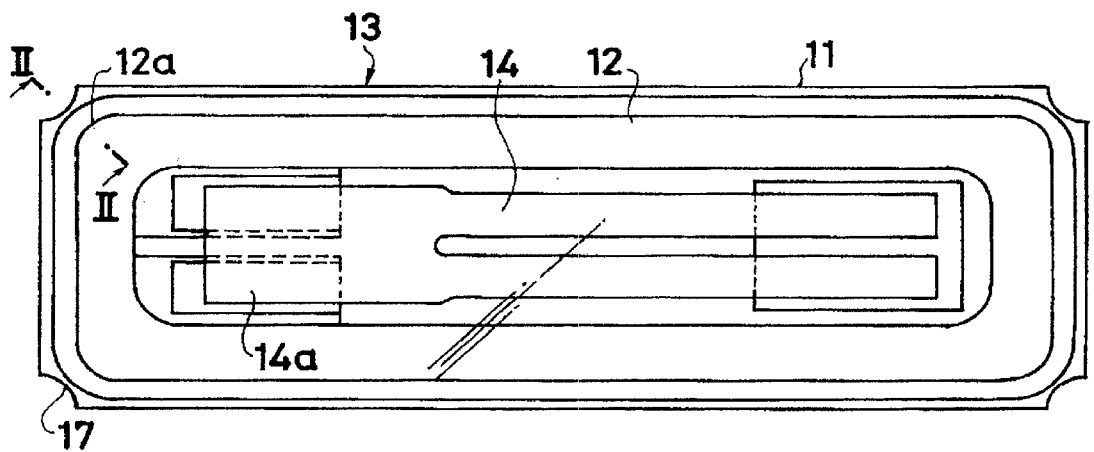
Figure 2:
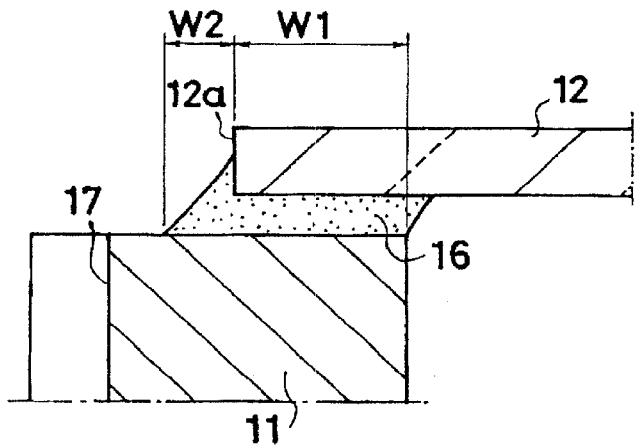

FIGS. 2(A)–2(C) show the piezoelectric resonator of Embodiment 2. The piezoelectric resonator is different from Embodiment 1 in that the corners of the lid 12 are rounded as a quarter arc.

This ensures, in a manner similar to Embodiment 1, and as apparently shown in FIG. 2(C), a sufficient sealing width w1 on the top surface of the base 11 at its corners along the entire periphery of the lid 12 and a sufficient margin width w2 for low-melting point glass 16 to travel around, thereby providing sufficient bonding and sealing strength and reducing the base 11 in length and width.

FIGS. 3(A)–(C) show the piezoelectric resonator of Embodiment 3. The piezoelectric resonator is different from Embodiment 2 in that the lid 12, having the corners rounded as a quarter arc, is tapered to the top surface along the entire periphery. This ensures, in a manner similar to Embodiments 1 and 2, a sufficient sealing width w1 on the top surface of the base 11 along the entire periphery of the lid 12, and a sufficient margin width w2 for the low-melting point glass 16 to travel around.

In addition, as is shown in FIG. 3(C), the tapered surface 12b transforms the lateral external force on package 13 into horizontal and vertical elements, and therefore reduces the force exerted on the bonding surfaces of the base top and the lid in their plane directions. Therefore, the package has enhanced bonding and sealing strength. The tapered part can be limited to the corners of the lid 12. Tapering at the corners that are particularly subject to direct external force provides a practically sufficient bonding and sealing strength via a simpler process than the tapering along the entire periphery of the lid 12. This enables the device to be manufactured via less labor and lower process cost.

FIGS. 4(A)–(C) show the piezoelectric resonator of Embodiment 3. The piezoelectric resonator is different from Embodiment 3 in that the lid 12, having the corners rounded as a quarter arc, is stepped 12c, instead of being tapered, to the upper surface along the entire periphery. The stepped part 12c reduces the risk of being trapped while the piezoelectric device is handled by a jig for assembly, and also reduces the risk of undesired external forces to the package 13. The stepped part can have two or more steps.

The lid 12 of the above embodiment can be processed into a desired form by cutting out thin glass sheets into a predetermined size of rectangular, and then processing the corners using a well known machining or etching, or other physical or chemical process, or even later developed processes. The lid can be processed into a desired form also using monolithic molding of glass material, such as embossing.

Figure 3:
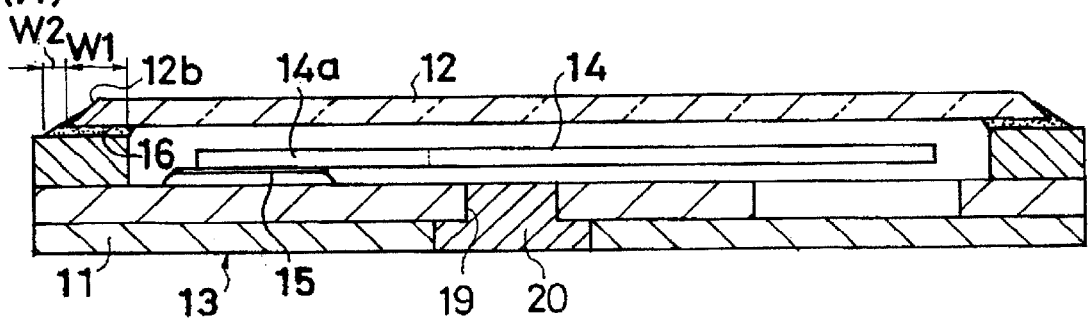
FIG. 3(A) is a vertical sectional view showing Embodiment 3 of the piezoelectric resonator according to present invention.
FIG. 3(B) is a plan view thereof.
FIG. 3(C) is an enlarged, partial sectional view taken along plane III—III in FIG. 3(B) showing the part bonded between the base and the lid.
Figure 3:
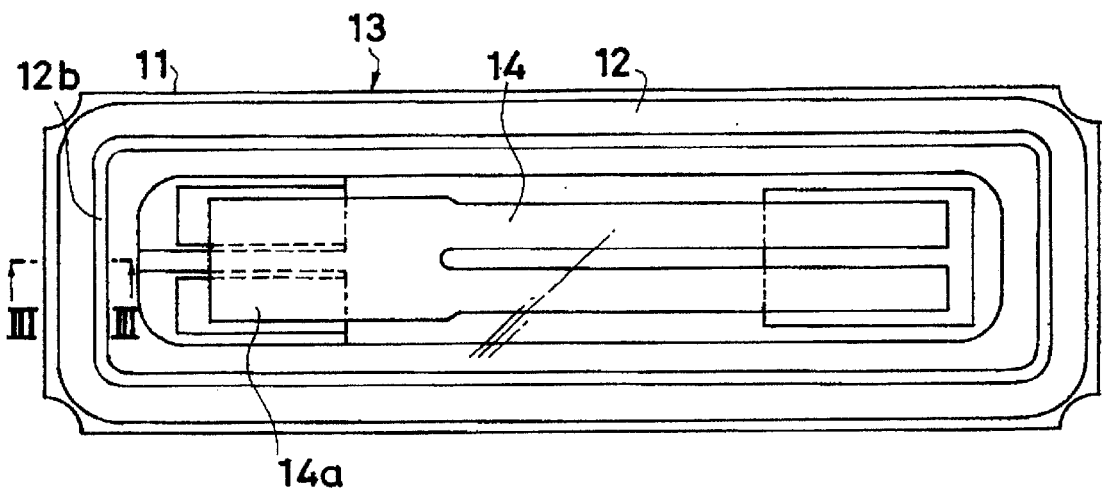
Figure 3:
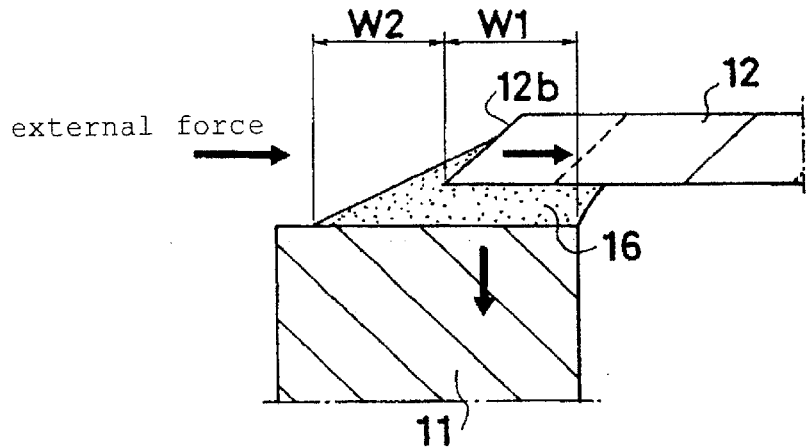
Figure 4:
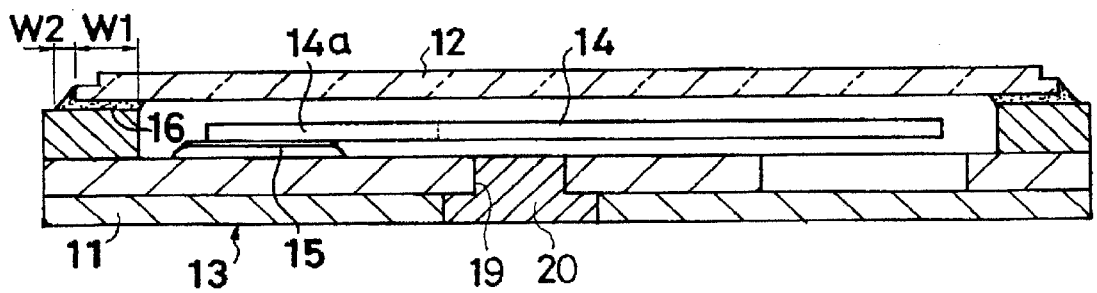
FIG. 4(A) is a vertical sectional view showing Embodiment 4 of the piezoelectric resonator according to present invention.
FIG. 4(B) is a plan view thereof.
FIG. 4(C) is an enlarged, partial sectional view taken along plane IV—IV in FIG. 4(B) showing the part bonded between the base and the lid.
Figure 4:
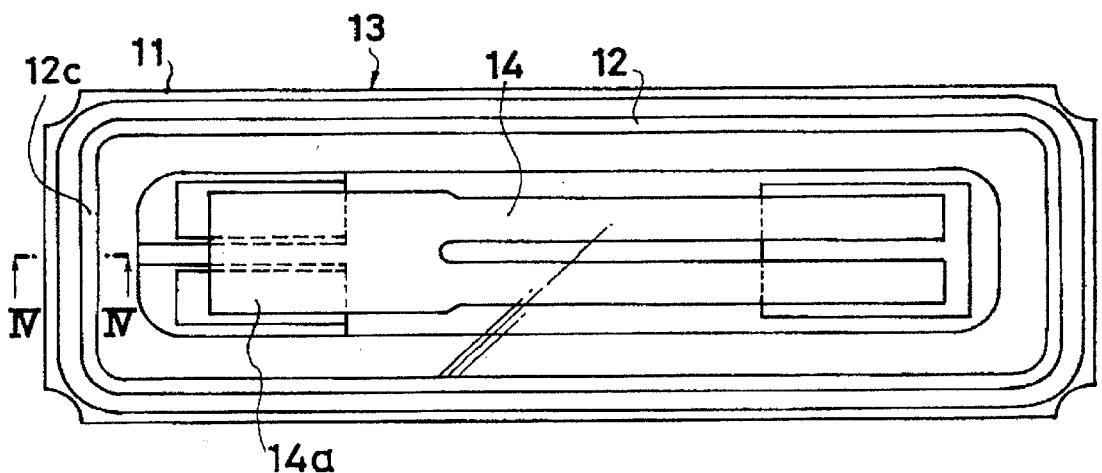
Figure 4:
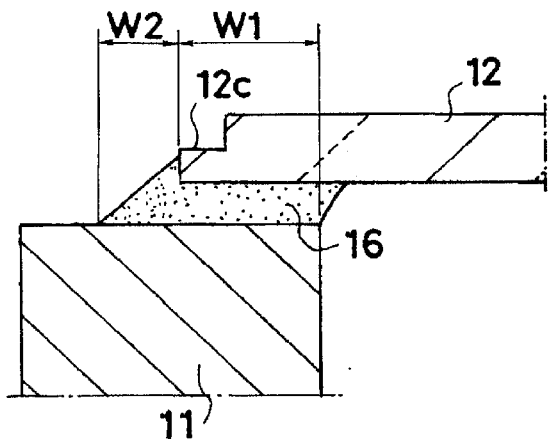
Figure 5:
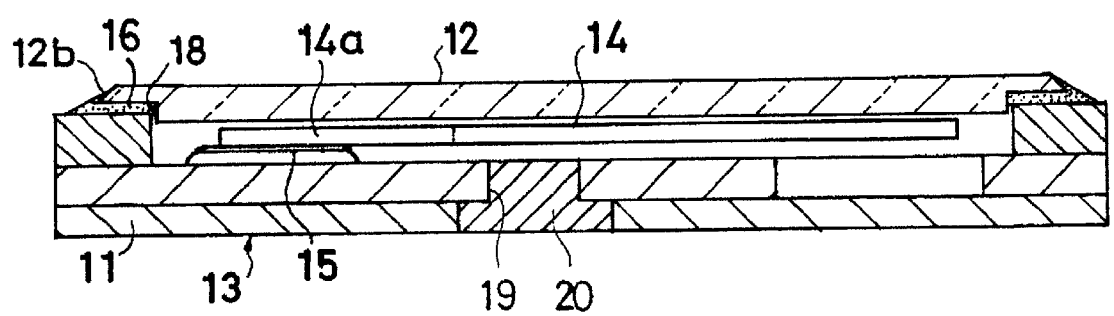
FIG. 5 is a vertical sectional view showing a modified embodiment of Embodiment 3.
Figure 6:
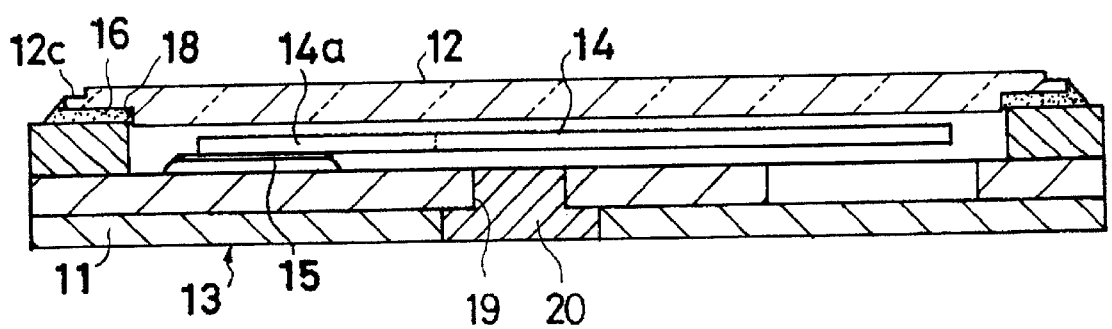
FIG. 6 is a vertical sectional view showing a modified embodiment of Embodiment 4.

FIGS. 5 and 6 show modified embodiments of Embodiments 3 and 4 shown in FIGS. 3 and 4, respectively. The piezoelectric resonator of these modified embodiments uses the lid 12, having a stepped part 18 on the lower surface along the entire periphery, which engages with the inner periphery of the recess in the base 11. The lid 12 is bonded to the base 11 with the stepped part 18 fitting the inner periphery of the base. This facilitates proper positioning of these elements. Furthermore, the lower surface of the lid 12 is inserted into the base by the height of the stepped part 18, reducing the height of the package 13 and accordingly flattening the piezoelectric device.

The stepped part 18 can be processed into a desired form by etching the lower surface periphery of the thin glass sheet or by attaching low-melting point glass onto the lower surface of the thin glass sheet, for example. It is preferred that low-melting point glass, to be attached onto the lower surface of the thin glass sheet, have a higher flexibility point, i.e., the temperature at which it starts showing flexibility and deformation, than the low-melting point glass 16 to seal the package 13. For instance, low-melting point glass, having a melting point of approximately 400° C., can be used to form the stepped part 18 when the low-melting point glass 16 has a melting point of 320° C.

Figure 7:
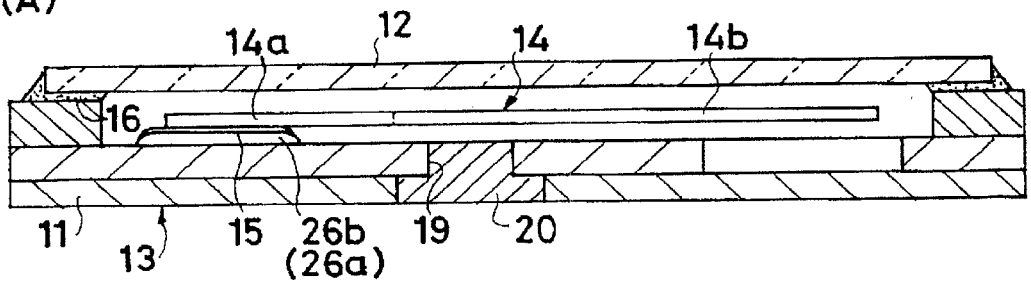
FIG. 7(A) is a vertical sectional view showing a modified embodiment of Embodiment 1.
FIG. 7(B) is a plan view thereof.
FIG. 7(C) is an enlarged, partial view of FIG. 7(B) showing the resonating arms.
FIG. 7(D) is an enlarged sectional view of the resonating arms taken along plane D—D in FIG. 7(C)
Figure 7:
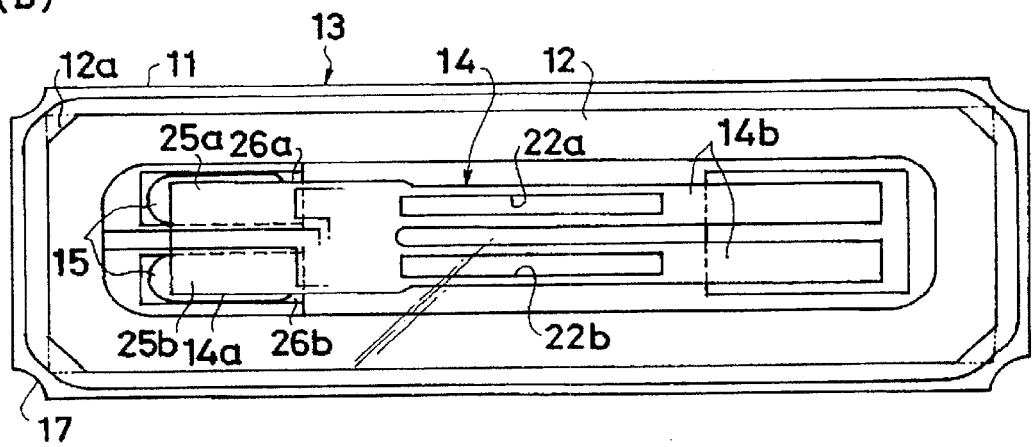
Figure 7:
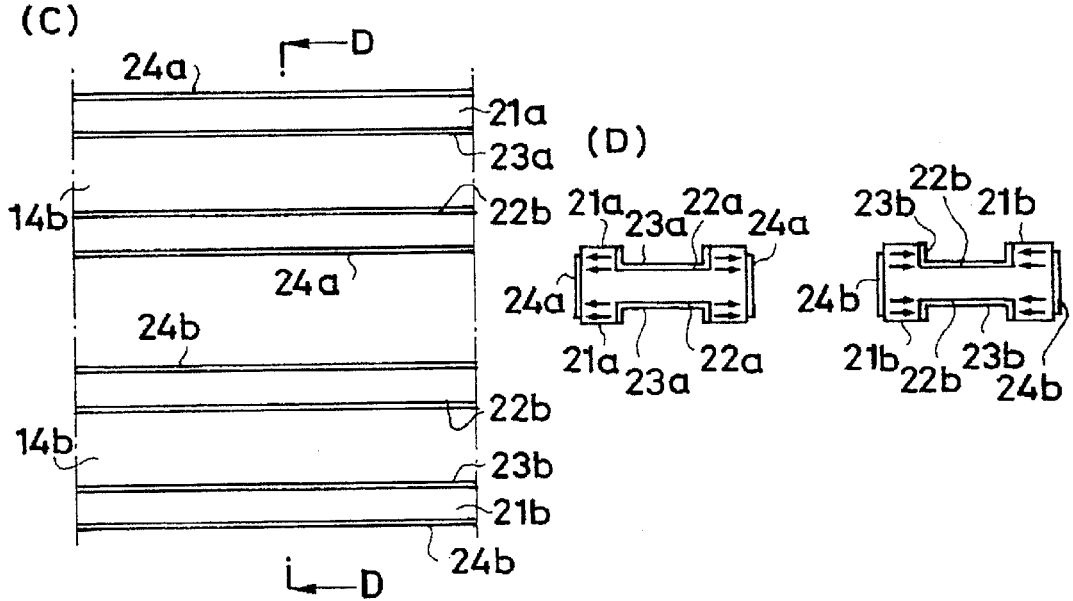

The tuning fork type quartz crystal resonators in FIGS. 7(A)–7(C) and 8(A)–8(C) respectively have a characteristic in the structure of the tuning fork type quartz crystal resonator element, in addition to the package 13 having the structure shown in FIGS. 1(A)–1(C). The tuning fork type quartz crystal resonator element 14 in FIG. 7 has a structure described in Japanese Laid-Open Patent S56-65517, for example, in which a pair of resonating arms 14b extending in parallel from the base portion 14a have respective upper and lower main surfaces 21a and 21b with linear grooves 22a and 22b are formed lengthwise. As shown in FIGS. 7(C) and (D), the grooves 22a and 22b of the resonating arms 14b are provided with first electrodes 23a and 23b, respectively, that include an electrode film formed on the side and bottom surfaces. The side surfaces of the resonating arms 14b are provided with second electrodes 24a and 24b. The first electrode 23a (23b) of one of the resonating arms is electrically connected to the second electrode 24b (24a) of the other resonating arms to form excitation electrodes that resonate the tuning fork type quartz crystal resonator element 14. Leading electrodes 25a and 25b from the excitation electrodes are provided to the base portion 14a and fixed to corresponding connection terminals 26a and 26b provided on the recess bottom of base 11 in a cantilever manner using conductive adhesive 15.

In the tuning fork type quartz crystal resonator element having the above structure, an electric field, parallel with the main surfaces, is created between the adjacent first and second electrodes 23a, 23b and 24a, 24b, as shown in FIG. 7(D) when alternating current is applied to the excitation electrodes via the connection terminals 26a and 26b. This can significantly increase the electric field efficiency and suppresses the CI value. However, the existence of air or other gas or low vacuum state within the package 13 causes the resonating arms 14b that flexes in the planes including the main surfaces to receive an air resistance force. A smaller package 13 and a smaller quartz crystal resonator element 14, which result from the downsizing of the quarts crystal resonator, cause more restriction on the flexural vibration of the resonating arms 14b, and therefore the CI value may not be as low as anticipated. The present invention uses the package 13 structured as described above to suppress gas production from low-melting point glass or conductive adhesive so that the package is sealed, with the inside being subject to a high vacuum. Therefore, the tuning fork type quartz crystal resonator of this embodiment can realize both miniaturization and a sufficiently lowered CI value.

Figure 8:
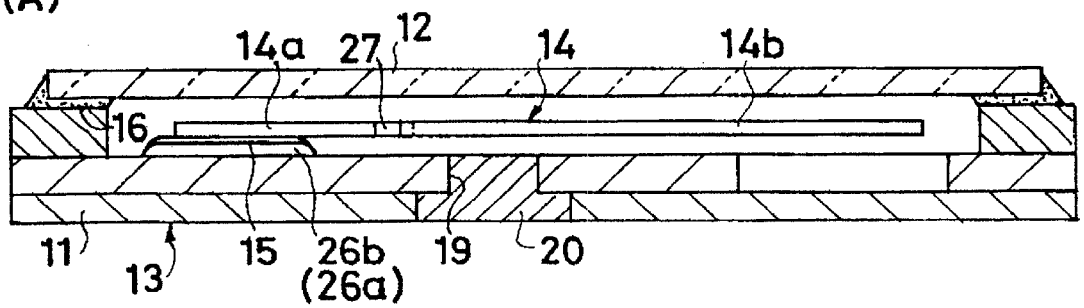
FIG. 8(A) is a vertical sectional view showing another modified embodiment of Embodiment 1.
FIG. 8(B) is a plan view thereof.
FIG. 8(C) is an enlarged, partial view of the base portion.
Figure 8:
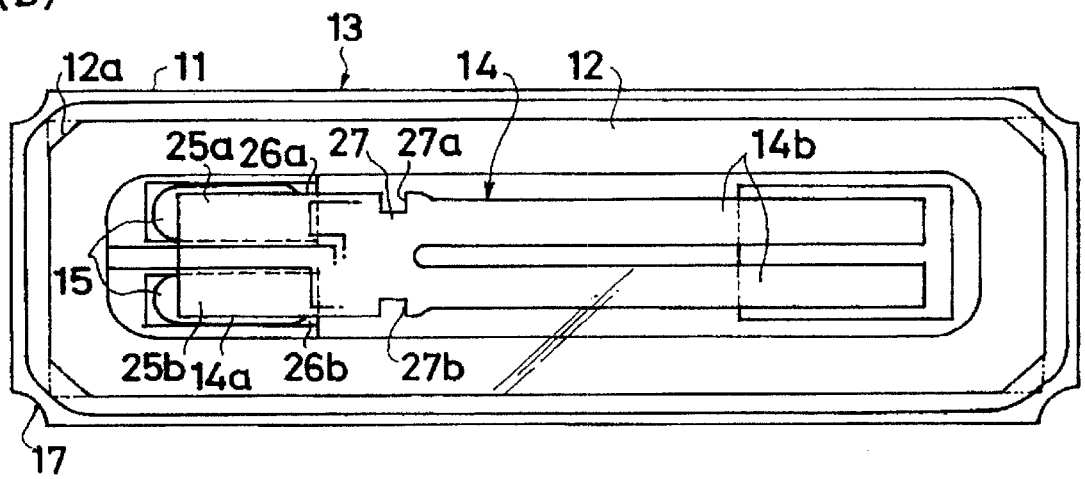
Figure 8:
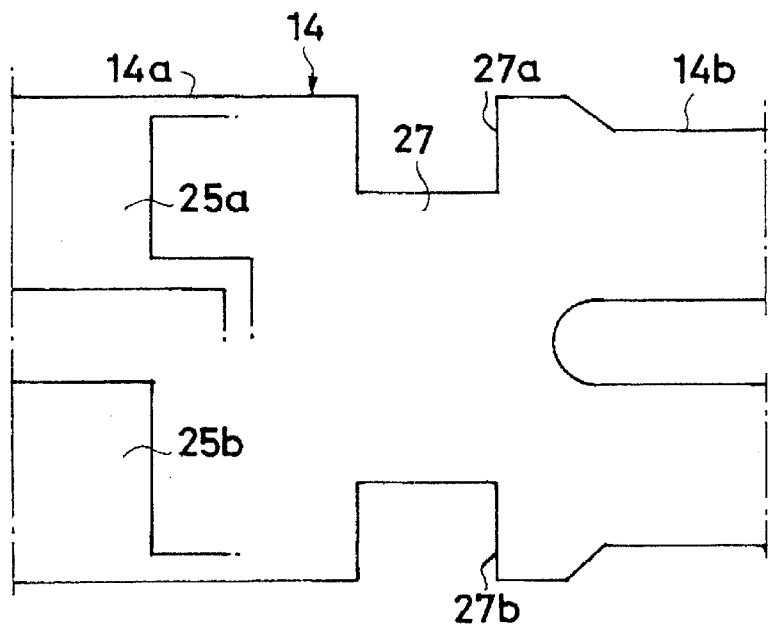
Figure 9:
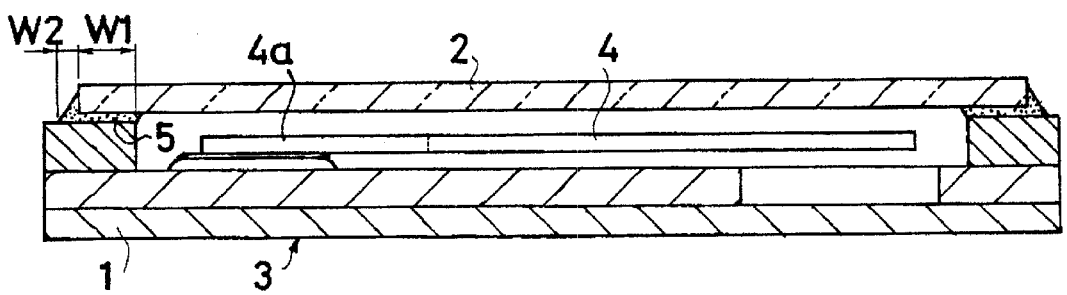
FIG. 9(A) is a vertical sectional view showing a related art piezoelectric resonator.
FIG. 9(B) is a plan view thereof.
FIG. 9(C) is an enlarged, partial sectional view taken along plane VII—VII in FIG. 9(B) showing the bonding part to the lid at the base corner.
FIG. 9(D) is a similar enlarged, partial sectional view showing another case of the part bonded to the lid at the base corner.
Figure 9:
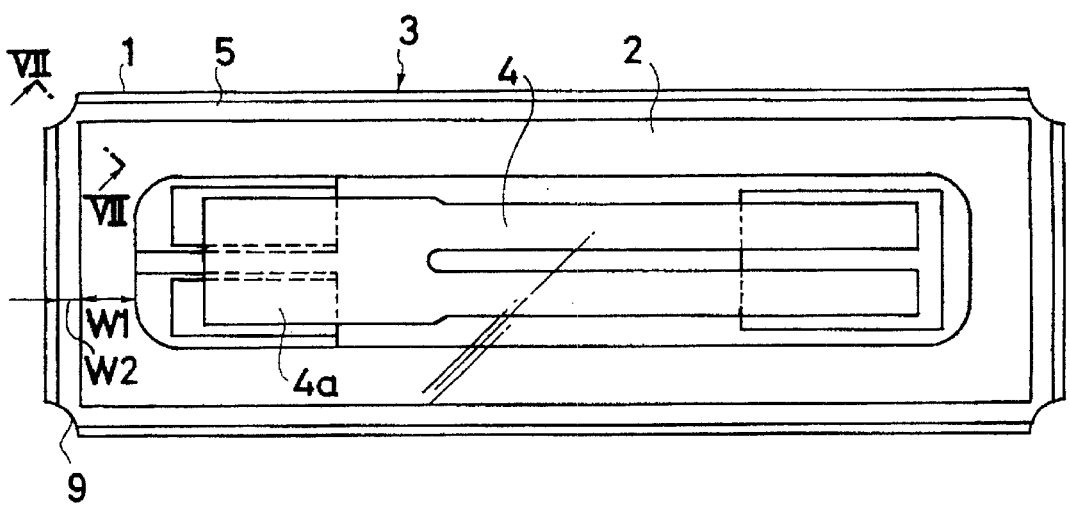
Figure 9:
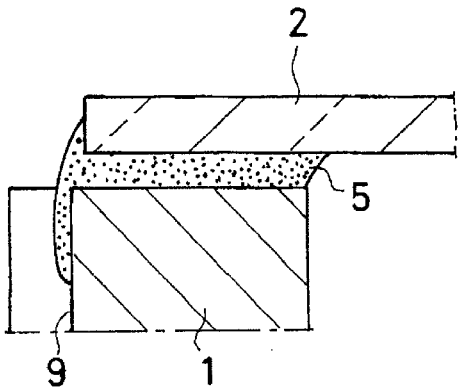
Figure 9:
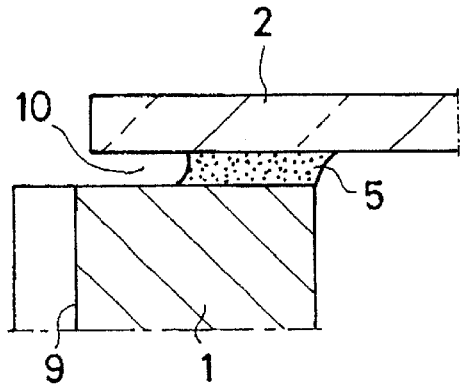

A tuning fork type quartz crystal resonator element 14 in FIGS. 8(A)–8(C) has a base portion 14a that is, similar to Embodiment 1, not only fixed onto the connection terminals 26a and 26b of the base 11 at the leading electrodes 25a and 25b from the excitation electrodes provided on the resonating arms 14b in a cantilever manner using conductive adhesive 15, but also provided with a constriction 27 including rectangular shaped notches 27a and 27b formed between the fixed part to the base 11 and the resonating arms 14b. The notches 27a and 27b prevent resonation of the resonating arms 14b from reaching the fixed part of the base portion 14a and, therefore, the resonating arms 14b have more freedom of flexural vibration. This results in suppressing the CI value. The constriction 27 can be provided by differently shaped notches other than rectangular and by differently shaped recesses formed on the sides of the base portion 14a.

Also in this embodiment, the existence of air or other gas, or low vacuum state, in the package 13 causes the notches 27a and 27b to receive more air resistance. Similar to the embodiment in FIGS. 7(A)–7(C), a smaller package 13 and a smaller quartz crystal resonator element 14, which result from miniaturizing the quartz crystal resonator, cause more restriction on the flexural vibration of the resonating arms 14b and, therefore, the CI value may not be as low as expected. The tuning fork type quartz crystal resonator of this embodiment uses the package 13 structured as described above to suppress gas production from low-melting point glass or conductive adhesive so that the package is sealed, with the inside being subject to a high vacuum, thereby providing more freedom of the flexural vibration to the resonating arms.

Therefore, the tuning fork type quartz crystal resonator of this embodiment can realize both miniaturization and a sufficiently lowered CI value.

Preferred embodiments are described above. As is apparent to a person in the field pertaining to the technique of this invention, the present invention can be realized by changing and modifying the embodiments described above without parting from the technical scope. For instance, the lid can be tapered both to the upper and lower surfaces so that low-melting point glass can easily go around. The tuning fork type quartz crystal resonator elements in FIGS. 7(A)–7(C) and 8(A)–8(C) can be used in combination.

They are also applied to the embodiments in FIGS. 2(A)–2(C) to 6, separately or in combination. The present invention can be similarly applied to a piezoelectric device, such as a quartz crystal oscillator in which an IC chip is mounted in the package to drive the quartz crystal resonator element.

The package for a piezoelectric device according to the present invention ensures a sufficient sealing width along the entire periphery of the base and the lid, and a sufficient margin width for low-melting point glass to travel around by bonding the lid formed as is described above to the base. This ensures sufficient bonding and sealing strength between the base and the lid and allows the miniaturization and flattening of a piezoelectric device.

Furthermore, the structure in which the package has a through hole in the base and is hermetically sealed with a sealing medium, suppresses gas production from the low-melting point glass or conductive adhesive in the process of mounting a piezoelectric resonator element or sealing the package, allowing sealing with the inside being subject to a high vacuum. When a tuning fork type quartz crystal resonator element is mounted in the package, frequency adjustment with high precision is also available along with vacuum sealing. Miniaturization of the piezoelectric device and suppressing of the CI value can be realized by a combination of structures in which one of the excitation electrodes is provided on the side surfaces of a groove formed on the main surfaces of the resonating arms and the constriction is provided at the base portion.

What is claimed is:

1. A package for a piezoelectric device, comprising:
   a base defining a top surface and an outer periphery and having a rectangular box shape;
   low-melting point glass;
   a lid defining a periphery and made of a thin rectangular glass sheet and bonded onto the top surface of the base via the low-melting point glass, corners of the rectangular lid being removed so as to define a margin with a specified width between the outer periphery of the base and the periphery of the lid, wherein the cut off corners of the rectangular lid are at least one of tapered or stepped; and
   a piezoelectric resonator element hermetically sealed in a space defined by the base and the lid.

2. The package for a piezoelectric device according to claim 1, the corners of the lid being rounded.

3. The package for a piezoelectric device according to claim 1, the cut off corners of the rectangular lid being tapered to upper surfaces.

4. The package for a piezoelectric device according to claim 1, the lid being tapered to an upper surface along the periphery.

5. The package for a piezoelectric device according to claim 1, the lid being stepped to an upper surface along the periphery.

6. The package for a piezoelectric device according to claim 1, the lid being stepped to a lower surface to engage with an inner periphery of the base.

7. The package for a piezoelectric device according to claim 1, the base having a through hole by which an inside of the package communicates with an exterior, the through hole being hermetically closed with a sealing medium.

8. A piezoelectric device, comprising:
   the package according to claim 7; and
   a tuning fork type piezoelectric resonator element having a base portion, a pair of resonating arms defining surfaces and excitation electrodes formed on the surfaces of the resonating arms, the tuning fork type piezoelectric resonator element being sealed in the package, the tuning fork type piezoelectric resonator element having excitation electrodes including first electrodes formed on main surfaces of the surfaces of the resonating arms, and second electrodes formed on side surfaces of the surfaces of the resonating arms, the first electrodes including an electrode film that is coated on the side surfaces of a groove formed lengthwise on at least one of the main surfaces of the resonating arms.

9. A piezoelectric device, comprising:
   a package for a piezoelectric device, comprising:
      a base defining a top surface and an outer periphery and having a rectangular box shape;
      low-melting point glass;
      a lid defining a periphery and made of a thin rectangular glass sheet and bonded onto the top surface of the base via the low-melting point glass, corners of the rectangular lid being removed so as to define a margin with a specified width between the outer periphery of the base and the periphery of the lid; and
      a piezoelectric resonator element hermetically sealed in a space defined by the base and the lid; and
   a tuning fork type piezoelectric resonator element having a base portion that is fixed on the base of the package and a pair of resonating arms, the tuning fork type piezoelectric resonator element being sealed in the package, the base portion of the tuning fork type piezoelectric resonator element having a constriction formed between a part fixed to the base and the resonating arms.

10. The piezoelectric device according to claim 8, further including an IC device mounted in the package.

11. The piezoelectric device according to claim 9, further including an IC device mounted in the package.

12. The piezoelectric device of claim 9, wherein the base has a through hole by which an inside of the package communicates with an exterior, the through hole being hermetically closed with a sealing medium.

13. A package for a piezoelectric device, comprising:
   a base defining a top surface and an outer periphery and having a rectangular box shape;
   low-melting point glass;
   a lid defining a periphery and made of a thin rectangular glass sheet and bonded onto the top surface of the base via the low-melting point glass, corners of the rectangular lid being removed so as to define a margin with a specified width between the outer periphery of the base and the periphery of the lid; and a piezoelectric resonator element hermetically sealed in a space defined by the base and the lid, wherein the base has a through hole by which an inside of the package communicates with an exterior, the through hole being hermetically closed with a sealing medium.

* * * * *